(12) United States Patent
Kikuiri et al.

(10) Patent No.: US 7,414,393 B2
(45) Date of Patent: Aug. 19, 2008

(54) MAGNETIC DETECTION DEVICE INCLUDING CIRCUIT SWITCHING AND PROCESSING INPUT OF TWO BRIDGE CIRCUITS

(75) Inventors: Katsuya Kikuiri, Niigata-ken (JP); Kiyoshi Sato, Niigata-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 0 days.

(21) Appl. No.: 11/679,093

(22) Filed: Feb. 26, 2007

(65) Prior Publication Data

US 2008/0054889 A1 Mar. 6, 2008

(51) Int. Cl.
G01B 7/14 (2006.01)
G01R 33/02 (2006.01)

(52) U.S. Cl. .................... 324/207.21; 324/252
(58) Field of Classification Search ............ 324/207.21, 324/207.25, 252, 173, 174, 179
See application file for complete search history.

(56) References Cited

U.S. PATENT DOCUMENTS 6,812,694 B2 * 11/2004 Uenoyama ............. 324/207.22

2006/0238190 A1 * 10/2006 Ishio ...................... 324/207.21

FOREIGN PATENT DOCUMENTS

| JP | 2003-14833 | 1/2003 |
| JP | 2003-14834 | 1/2003 |
| JP | 2003-121268 | 4/2003 |
| JP | 2004-77374 | 3/2004 |
| JP | 2004-180286 | 6/2004 |
| JP | 2004-304052 | 10/2004 |
| JP | 2005-214900 | 8/2005 |

\* cited by examiner

*Primary Examiner*—Patrick Assouad
*Assistant Examiner*—David M. Schindler
(74) *Attorney, Agent, or Firm*—Brinks Hofer Gilson & Lione

(57) ABSTRACT

A magnetic detection device of a NS detection type is provided. A magnetic detection device comprising a first series circuit, a second series circuit, and a third series circuit. At least one of a plurality of resistance elements forming the first series circuit includes a first magneto-resistance element using a magneto-resistance effect, of which an electric resistance varies with an external magnetic field of any one direction. At least one of a plurality of resistance elements forming the second series circuit includes a second magneto-resistance element using a magneto-resistance effect, of which an electric resistance varies with an external magnetic field of a direction apposite to the one direction.

4 Claims, 12 Drawing Sheets

MAGNETIC DETECTION DEVICE INCLUDING CIRCUIT SWITCHING AND PROCESSING INPUT OF TWO BRIDGE CIRCUITS

This patent document claims the benefit of Japanese Patent Application No. 2006-236492 filed on Aug. 31, 2006, which is hereby incorporated by reference.

BACKGROUND

1. Field

The present embodiments relate to a magnetic detection device having magnetic-resistance elements, and more particularly, to a magnetic detection device of a NS detection type capable of simplifying a circuit configuration with a decrease in the number of elements.

2. Related Art

FIG. 17 is a circuit diagram of a known magnetic detection device. The magnetic detection device includes a sensor unit S and an integrated circuit (IC) 1. The magnetic detection device shown in FIG. 17 is a NS detection type sensor. The NS detection type sensor detects both the positive magnetic field and negative magnetic field, for example north pole direction and south pole direction. The sensor unit S has a first bridge circuit BC1 including first magneto-resistance elements 2 such as a GMR element of which electric resistance varies with an external magnetic field in a positive direction and a second bridge circuit BC2 including second magneto-resistance elements 3, such as a GMR element, that has a variable resistance in response to an external magnetic field in a negative direction. "An external magnetic field in a positive direction" generally indicates the external magnetic field in any random direction, but in FIG. 17, that indicates the external magnetic field in the direction in which the resistance of the first magneto-resistance elements 2 varies but the resistance of the second magneto-resistance elements 3 does not vary (i.e. functions as a fixed resistance element). "An external magnetic field in a negative direction" indicates an opposite direction of the external magnetic field in the positive direction, and in FIG. 17, that indicates the direction of the external magnetic field in which the resistance of the second magneto-resistance elements 3 is not fixed but the resistance of the first magneto-resistance elements 2 is fixed (i.e. function as fixed resistance element).

As shown in FIG. 17, the first magneto-resistance elements 2 and the fixed resistance elements 4 form series circuits respectively, and the series circuits are connected in parallel to each other to form the first bridge circuit BC1. Each output extracting portion of two series circuits forming the first bridge circuit BC1 is connected to a first differential amplifier 6. As shown in FIG. 17, each second magneto-resistance element 3 and each fixed resistance element 5 forms a series circuit, and the series circuits are connected in parallel to each other to form the second bridge circuit BC2. Each output extracting portion of two series circuits forming the second bridge circuit BC2 is connected to a second differential amplifier 7.

Inside the integrated circuit 1 is provided with not only the differential amplifiers 6 and 7, but also schmitt trigger type comparators 12 and 13, latch circuits 8 and 9, and the like. An external magnetic field detection signal is taken out from external output terminals 10 and 11.

If the external magnetic field in the positive direction acts on the magnetic detection device shown in FIG. 17, then the resistance of the first magneto-resistance elements 2 forming the first bridge circuit BC1 is varied. As the result, an output of the first bridge circuit BC1 is amplified in the first differential amplifier 6, and the detection signal caused by the amplified output is generated, then the detection signal is outputted from the first external output terminal 10. On the other hand, if the external magnetic field in the negative direction acts on the magnetic detection device, then the resistance of the second magneto-resistance elements 3 forming the first bridge circuit BC2 is varied. As the result, an output of the second bridge circuit BC2 is amplified in the second differential amplifier 7, and the detection signal caused by the amplified output is generated, then the detection signal is outputted from the second external output terminal 11.

As mentioned above, the magnetic detection device shown in FIG. 17 includes a NS detection type sensor which is detectable in any direction (such as the positive and negative directions) of the external magnetic field.

The following references are examples of the related art: JP-A-2004-77374, JP-A-2004-180286, JP-A-2005-214900, JP-A-2003-14833, JP-A-2003-14834, JP-A-2003-121268 and JP-A-2004-304052.

However, the magnetic detection device in the past shown in FIG. 17 needs a lot of elements for putting together the sensor unit S. Specifically, to configure the NS detection type sensor, two bridge circuit, BC1 and BC2, is respectively needed, consequently, totally eight number of elements are needed.

Since the magnetic detection device includes two bridge circuits BC1 and BC2, the differential amplifiers 6 and 7, the comparators 12 and 13, signal lines and the like need to be provided in each bridge circuit BC1 and BC2, so the circuit configuration is complicated, and also there is an obstacle to decrease in size of the integrated circuit 1.

SUMMARY

The present embodiments may solve the aforementioned problem in the past, and particularly, an object is to provide a magnetic detection device of a NS detection type capable of simplifying a circuit configuration in accompany with decrease in the number of elements.

In order to accomplish the above mentioned object, according to an aspect of the invention, there is provided magnetic detection device comprising a first series circuit, a second series circuit, and a third series circuit, wherein at least one of a plurality of resistance elements forming the first series circuit includes a first magneto-resistance element using a magneto-resistance effect, of which an electric resistance varies with an external magnetic field of any one direction, wherein at least one of a plurality of resistance elements forming the second series circuit includes a second magneto-resistance element using a magneto-resistance effect, of which an electric resistance varies with an external magnetic field of a direction apposite to the one direction, wherein a plurality of resistance elements forming the third series circuit is common resistance elements connected to the resistance elements of the first series circuit and the resistance elements of the second series circuit in a bridge manner, wherein a first output extracting portion of the first series circuit and a second output extracting portion of the second series circuit are individually connected to a common differential output portion through a first switch portion and a third output extracting portion of the third series circuit is connected the common differential output portion, and wherein a first bridge circuit so as to detect the external magnetic field of the one direction including the first series circuit and the third series circuit connected in parallel to each other is switched to a connection state with the differential output portion when the first output extracting portion is connected to the differential output portion by the first switch portion, and a second bridge circuit so as to detect the external magnetic field of the opposite direction including the second series circuit and the third series circuit connected in parallel to each other is switched to a connection state with the differential output portion when the second output extracting portion is connected to the differential output portion by the first switch portion.

According to the invention, by using the aforementioned configuration, there are advantages in a magnetic detection device of a NS detection type capable of simplifying a circuit configuration in accompany with decrease in the number of elements by comparison with a magnetic detection device in the past. To clarify, forming the third series circuit into common line of the bridge circuit of the first the bridge circuit and the second bridge circuit, the invention may enable to reduce the number of elements required for forming two bridges in comparison with the past. Moreover, the invention is provided with the first switch portion, therefore the first switch portion switch over between a connecting the first output extracting portion to the differential output portion and a connecting the second output extracting portion to the differential output portion, whereby a simple circuit configuration may be obtained in the state of the first bridge circuit and second bridge circuit connected to differential output portion.

According to the invention, a first resistance element and a second resistance element of the first series circuit are connected in series through the first output extracting portion, and the first resistance element is formed of the first magneto-resistance element. A third resistance element and a fourth resistance element of the second series circuit are connected in series through the second output extracting portion, and the third resistance element is formed of the second magneto-resistance element. A fifth resistance element and a sixth resistance element of the third series circuit are connected in series through the third output extracting portion. The first resistance element is connected in parallel to the sixth resistance element and the second resistance element is connected in parallel to the fifth resistance element, thereby forming the first bridge circuit. The third resistance element is connected in parallel to the fifth resistance element and the fourth resistance element is connected in parallel to the sixth resistance element, thereby forming the second bridge circuit.

According to the invention, The magnetic detection device, further including a first external output terminal, a second external output terminal, and a second switch portion switching over a connection between the differential output portion and the first external output terminal and a connection between the differential output portion and the second external output terminal, wherein the differential output portion and the first external output terminal may be connected to each other by the second switch portion when the first output extracting portion and the differential output portion are connected to each other by the first switch portion, and the differential output portion and the second external output terminal may be connected to each other by the second switch portion when the second output extracting portion and the differential output portion are connected to each other by the first switch portion.

According to the invention, a NS detection type sensor of two way output that is also possible to detect the external magnetic field direction may be available by using a simple circuit configuration.

According to the invention, the magnetic detection device further including a third switch portion switching over a connection between the first series circuit and at least one of an input terminal and an earth terminal, and a connection between the one terminal and the second series circuit, wherein the first series circuit and one of the terminals are connected to each other by the third switch portion when the first output extracting portion and the differential output portion are connected to each other by the first switch portion, and the second series circuit and the one terminal are connected to each other by the third switch portion when the second output extracting portion and the differential output portion are connected to each other by the first switch portion. Whereby, the invention has such advantages as a low consumption in current and an improvement of the detection sensitivity because there is no current in any one series circuit disconnected to differential output portion of the first series circuit and second series circuit.

Consequently, according to the invention, the magnetic detection device of the NS detection type may have such advantages as decrease in the number of elements, a simple circuit configuration and also a low consumption in current.

DETAILED DESCRIPTION

Figure 1:
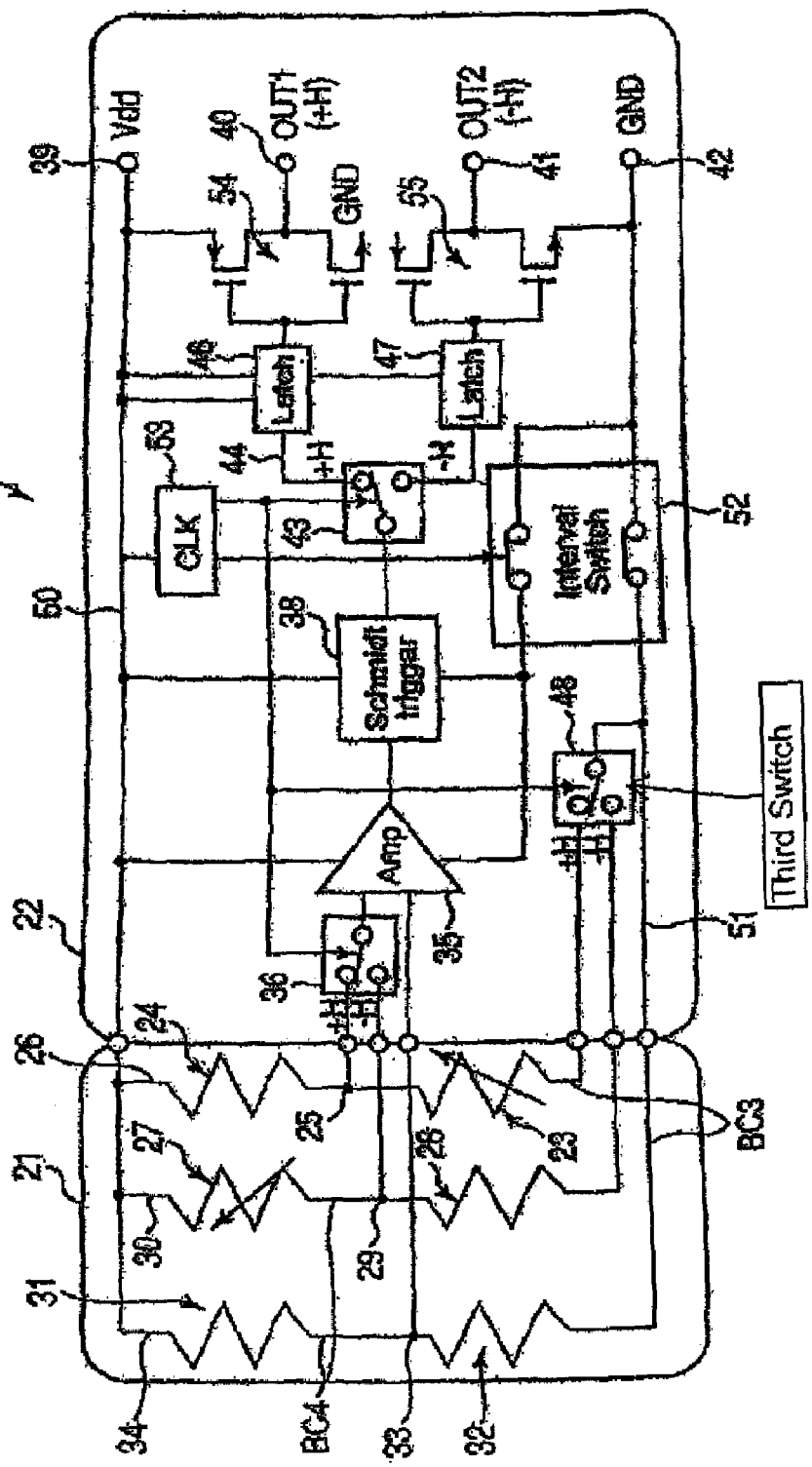
FIG. 1 is a circuit diagram illustrating a state of an external magnetic field detection circuit in the positive direction of a magnetic detection device according to an embodiment of the invention.

The magnetic detection device 20 illustrated in FIG. 1 includes a sensor unit 21 and an integrated circuit (IC) 22.

The sensor unit 21 includes a first series circuit 26 of which a first resistance element (a first magneto-resistance effect element) 23 is series connected to a second resistance element (a fixed resistance element according to embodiment) 24 through a first output extracting portion(a connection portion) 25, a second series circuit 30 of which a third resistance element (a second magneto-resistance effect element) 27 is series connected to a fourth resistance element (the fixed resistance element according to embodiment) 28 through a second output extracting portion(the connection portion) 29, and a third series circuit 34 of which a fifth resistance element (the fixed resistance element) 31 is series connected to a sixth resistance element (the fixed resistance element) 32 through a third output extracting portion 33.

As mentioned above, "the resistance element" is marked in a serial number which is from the first to the sixth. Hereinafter, each resistance element is mainly marked as "the magneto-resistance effect element" and "the fixed resistance element" In the following. When it is not necessary to distinguish between "the magneto-resistance effect element" and "the fixed resistance element", a mark of "a resistance element" will be used.

The third series circuit 34 is a common circuit, thereby forming a bridge circuit with the first series circuit 26 and the second series circuit 30 respectively. Hereinafter, a bridge circuit formed by connecting the first series circuit 26 to the third series circuit 34 in parallel will be designated as a first bridge circuit BC3 and the bridge circuit formed by connecting the second series circuit 30 to the third series circuit 34 in parallel will be designated as a second bridge circuit BC4.

As shown in FIG. 1, the first bridge circuit BC3 has a formation as the first resistance element 23 is connected to the sixth resistance element 32 in parallel and the second resistance element 24 is connected to the fifth resistance element 31 in parallel. The second bridge circuit BC4 has a formation as the third resistance element 27 is connected to the fifth resistance element 31 in parallel and the fourth resistance element 28 is connected to the sixth resistance element 32 in parallel.

As shown in FIG. 1, the integrated circuit 22 includes an input portion (power) 39, an earth terminal 42, and two of external output terminals 40 and 41. The input portion (power) 39, the earth terminal 42, and two of external output terminals 40 and 41 are electrically connected to a terminal of another device not shown in the drawings by a wire bonding method or a die bonding method.

A signal line 50 connected to the input portion 39 and the signal line 51 connected to the earth terminal 42 are connected to electrodes prepared on the ends of the both sides of the first series circuit 26, the second series circuit 30, and the third series circuit 34.

As shown in FIG. 1, the integrated circuit 22 includes one differential amplifier 35 and one of a + input portion and a − input portion of the differential amplifier 35 is connected to the third output extracting portion 33 of the third series circuit 34. The connection between the third output extracting portion 33 and the differential amplifier 35 is differently fixed as connection state among the first output extracting portion 25 of the first series circuit 26, the second output extracting portion 29 of the second series circuit 30, and the differential amplifier 35 (there is no case as non connection state).

The first output extracting portion 25 of the first series circuit 26 and the second output extracting portion 29 of the second series circuit 30 are connected to the input portion of the first switch circuit (a first switch portion) 36 respectively. The output portion of the first switch circuit 36 is connected to one of the − input portion and the + input portion (the input portion of which the third output extracting portion 33 is not connected).

As shown in FIG. 1, the output terminal of the differential amplifier 35 is connected to a schmitt trigger-type comparator 38. The output terminal of the comparator 38 is connected to the input portion of the second switch circuit (the second switch portion) 43. The output terminal of the second switch circuit 43 is connected to two of latch circuits 46 and 47, thereby connecting to a first external output terminal 40 and a second external output terminal 41 respectively through a FET circuit 54 and 55.

As shown in FIG. 1, the integrated circuit 22 includes a third switch circuit 48. The output terminal of the third switch circuit 48 is connected to the signal line 51 connected to the earth terminal 42. The input portion of the third switch circuit 48 is connected to one end of the first series circuit 26 and the second series circuit 30.

As shown in FIG. 1, the integrated circuit 22 includes an interval switch circuit 52 and a clock circuit 53. When the interval switch circuit 52 is off, electrification within the integrated circuit 22 is stopped. On and Off of the interval switch circuit 52 is interlocked with a clock from the clock circuit 53 and the interval switch circuit 52 has an electric power saving function which intermittently electrifies.

The clock signal out of the clock circuit 53 is outputted to the first switch circuit 36, the second switch circuit 43, and the third switch circuit 48 respectively. When the clock signal is received in the first switch circuit 36, the second switch circuit 43, and the third switch circuit 48, the clock signal is distributed to perform the operation of the switch at very short interval, thereby controlling the operation of the switch. For example, when one pulse duration of clock signal is in several tens of msec, the switch operates every several tens of μmsec.

The first magneto-resistance element 23 is the magneto-resistance element which shows a magneto-resistance effect on the basis of a variation in external magnetic field magnitude in a positive direction (+H) and the second magneto-resistance element 27 is the magneto-resistance element which shows the magneto-resistance effect on the basis of the variation in external magnetic field magnitude in a negative direction (−H) which is opposite to the positive direction.

Herein, the external magnetic field in the positive direction (+H) indicates one of directions which is the shown X1 direction in the aspect of the embodiment. As described in FIG. 3, FIG. 4, the resistance of the first magneto-resistance element 23 is varied, however the resistance of the second magneto-resistance element 27 is not varied (specifically function as fixed resistance element).

Otherwise, the external magnetic field in the negative direction (−H) which is opposite to the positive direction indicates the shown X2 direction. As described in FIG. 3, FIG. 4, the resistance of the second magneto-resistance element 27 is varied, however the resistance of the first magneto-resistance element 23 is not varied (specifically function as fixed resistance element).

Hereinafter, layer structures and hysteresis characteristics related to the first magneto-resistance element 23 and the second magneto-resistance element 27 will be described in detail.

Figure 7:
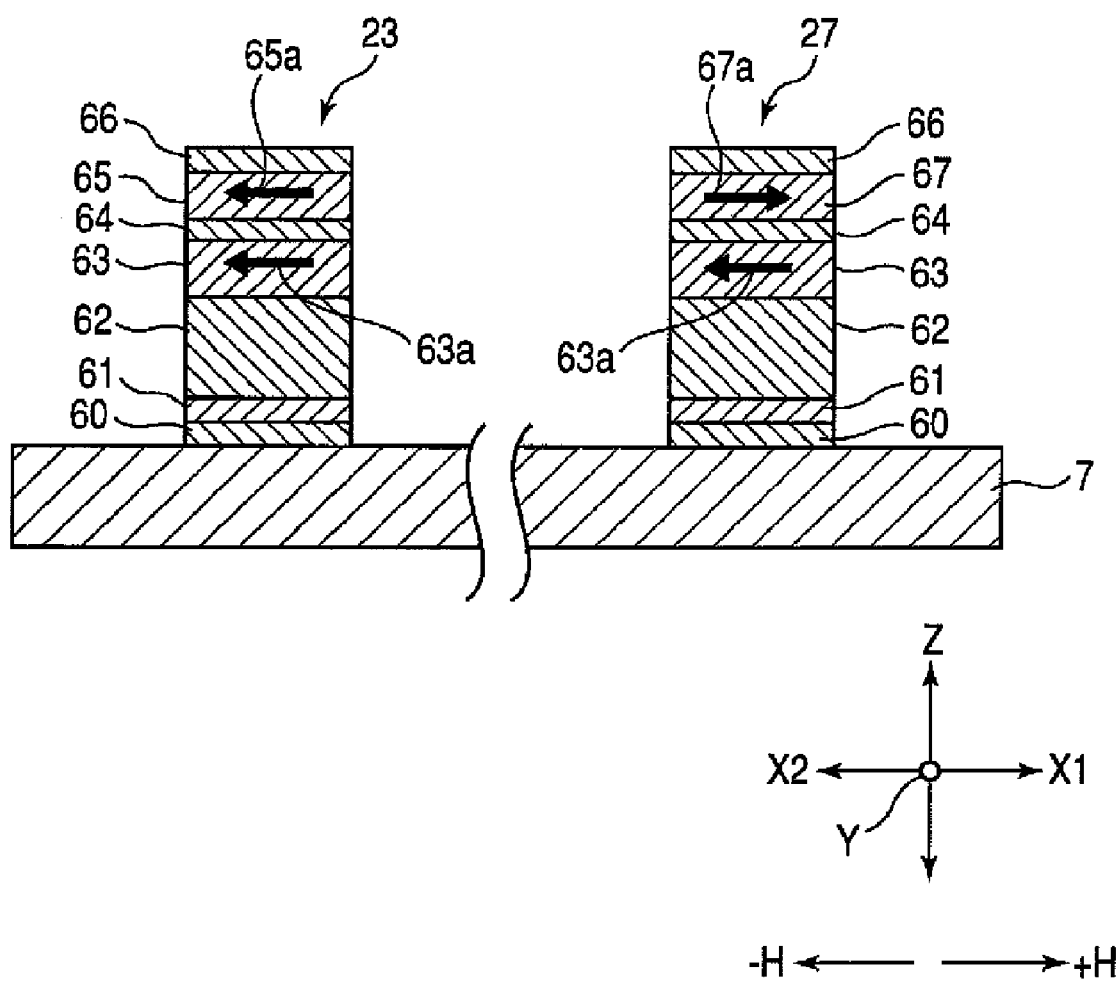
FIG. 7 is a partially sectional view illustrating layer structures of the first magneto-resistance and the second magneto-resistance.

As shown in FIG. 7, the first magneto-resistance element 23 and the second magneto-resistance element 27 have layers which is sequentially laminated from the bottom of an underlying layer 60, a seed layer 61, an antiferromagnetic layer 62, a fixed magnetic layer 63, a non-magnetic intermediate layer 64, free magnetic layers 65 and 67 (the free magnetic of the second magneto-resistance element 27 is a reference numeral 37), and a protection layer 66. The underlying layer 60 is formed of a non-magnetic material at least one element of such as Ta, Hf, Nb, Zr, Ti, Mo, W. The seed layer 61 is formed of NiFeCr or Cr and or like. The antiferromagnetic layer 62 is formed of an antiferromagnetic material containing element α (but, α is at least one element of Pt, Pd, Ir, Rh, Ru, Os) and Mn, or an antiferromagnetic material containing element α and element α' (but, element α' is at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and a rare-earth elements and Mn. For example, the antiferromagnetic layer 62 is formed of IrMn or PtMn. The fixed magnetic layer 63 and the free magnetic layers 65 and 67 are formed of a magnetic material such as CoFe alloy, NiFe alloy, CoFeNi alloy and the like. The non-magnetic intermediate layer 64 is formed of Cu and the like. The protection layer 66 is formed of Ta and the like. The fixed magnetic layer 63 or the free magnetic layers 65 and 67 have a lamination layer ferri structure (A lamination structure has a sequential laminated order of the magnetic layer, the non-magnetic layer, and the magnetic layer. The non-magnetic layer is interposed between two of the magnetic layers which has an anti-parallel magnetization direction). Additionally, the fixed magnetic layer 63 or the free magnetic layers 65 and 67 may have the lamination structure of which a plurality of magnetic layers made of a different material is laminated.

Figure 5:
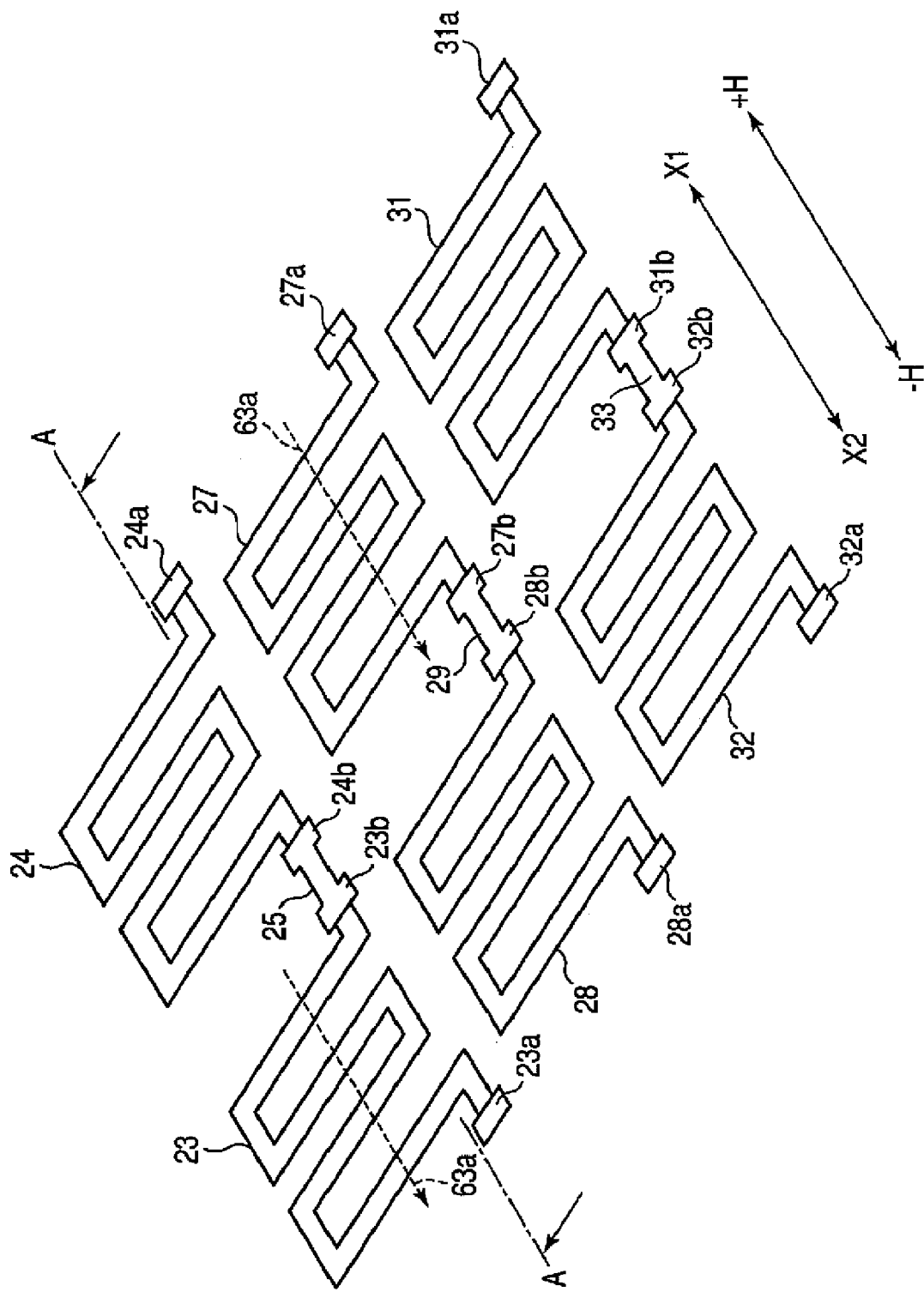
FIG. 5 is a partially enlarged perspective view of the magnetic detection device 20 illustrating a shape resistance element of a sensor unit of the magnetic detection device according to an embodiment.

In the first magneto-resistance element 23 and the second magneto-resistance element 27, the antiferromagnetic layer 62 is formed in contact with the fixed magnetic layer 63, whereby an exchanging coupling magnetic field (Hex) is made on an interface between the antiferromagnetic layer 62 and the fixed magnetic layer 63 by a heat treatment in a magnetic field, thereby fixing the magnetization direction to one direction. FIGS. 5 and 7 indicate the magnetization direction 63a of the fixed magnetic layer as an arrow direction. In the first magneto-resistance element 23 and the second magneto-resistance element 27, the magnetization direction 63a of the fixed magnetic layer 63 is the shown X1 direction (i.e. the positive direction).

Meanwhile, the magnetization direction of the free magnetic layers 65 and 67 is different between the first magneto-resistance element 23 and the second magneto-resistance element 27. As shown in FIG. 7, in the first magneto-resistance element 23, the magnetization direction 65a of the free magnetic layer 65 is the shown X2 direction (i.e. the negative direction), which is in the same as the magnetization direction 63a of the fixed magnetic layer 63, but in the second magneto-resistance element 27, the magnetization direction 67a of the free magnetic layer 67 is the shown X1 direction (the positive direction), which is in the opposite direction, but parallel, with respect to the magnetization direction 63a of the fixed magnetic layer 63.

Figure 3:
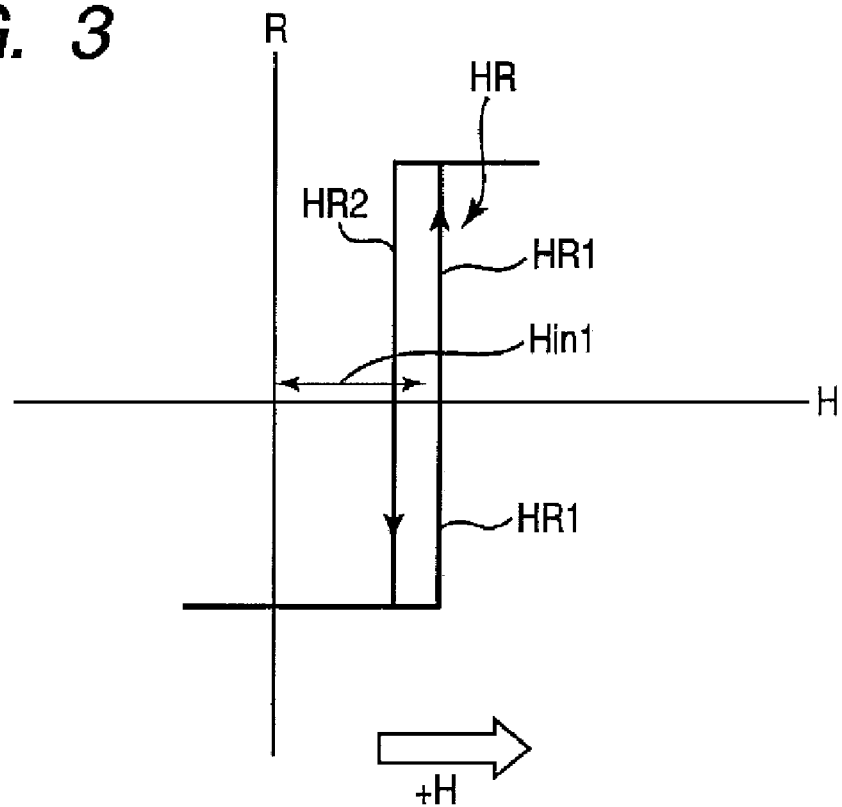
FIG. 3 is a graph (curve R-H) illustrating a hysteresis characteristic of a first magneto-resistance element.

When the external magnetic field in the positive direction (+H) acts, the magnetization 67a of the free magnetic layer 67 of the second magneto-resistance element 27 is not varied, but the magnetization 65a of the free magnetic layer 65 of the first magneto-resistance element 23 varies with the consequence that the resistance of the first magneto-resistance element 23 varies. FIG. 3 is the curve R-H illustrating the hysteresis characteristic of the first magneto-resistance element 23. Additionally, a vertical axis is the resistance R in the FIG. 3, but it may be a variation rate of the resistance (%). As shown in FIG. 3, when the external magnetic field is gradually increased from a non-magnetic field (zero) to the positive direction, a state of equilibrium between the magnetization 65a of the free magnetic layer 65 and the magnetization 63a of the fixed magnetic layer 63 is given away with the consequence that it becomes close to an anti-parallel state, whereby the resistance R of the first magneto-resistance element 23 gradually becomes large taking along the curve HR1. When the external magnetic field in the positive direction (+H) is gradually decreased to the zero, the resistance R is gradually decreased taking along the curve HR2.

Likewise, in the first magneto-resistance element 23, a hysteresis loop HR surrounded by the curves HR1 and HR2 is formed according to the variation in magnetic field magnitude of the external magnetic field in the positive direction (+H). A middle point of the hysteresis loop HR is a central value between a maximum resistance and a minimum resistance of the first magneto-resistance element 23, and a central value of a width of the hysteresis loop HR. The magnitude of the Hin1 (i.e. a first inter-layer coupling magnetic field) is determined by the magnitude of the magnetic field in the range of the center point of the hysteresis loop HR to the magnetic field line H=0 (Oe). As shown in FIG. 3, in the first magneto-resistance element 23, Hin1 (i.e. the first inter-layer coupling magnetic field) is shifted toward the magnetic field in the positive direction.

Meanwhile, when the external magnetic field in the negative direction (−H) acts, the magnetization 65a of the free magnetic layer 65 of the first magneto-resistance element 23 does not vary, but the magnetization 67a of the free magnetic layer 67 of the second magneto-resistance element 27 varies with the consequence that the resistance of the second magneto-resistance element 27 varies.

Figure 4:
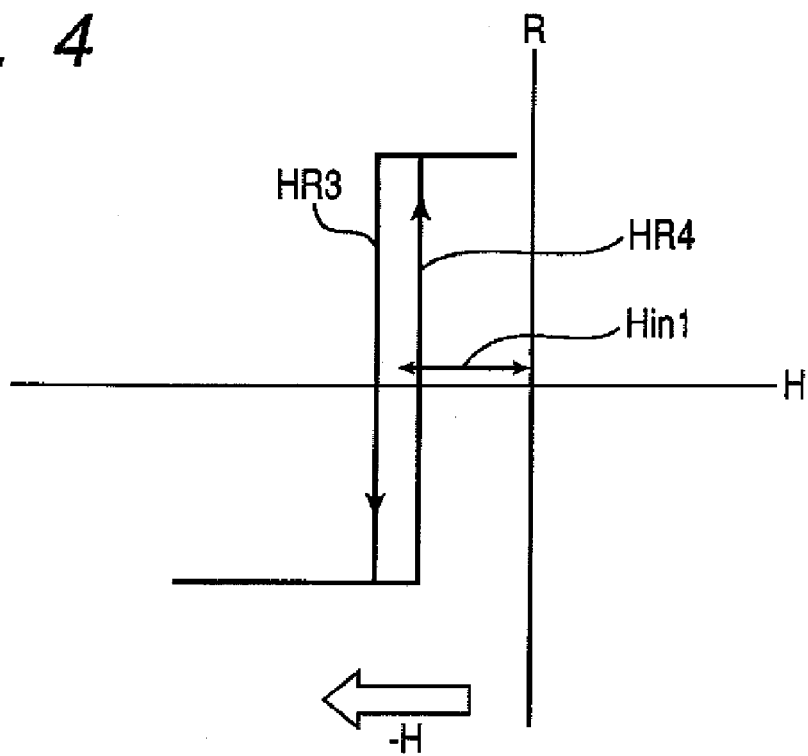
FIG. 4 is a graph (curve R-H) illustrating a hysteresis characteristic of a second magneto-resistance element.

FIG. 4 is the curve R-H illustrating the hysteresis characteristic of the second magneto-resistance element 27. As shown in FIG. 4, when the external magnetic field is gradually increased from the non-magnetic field state (zero) to the negative direction, the anti-parallel state between the magnetization 67a of the free magnetic layer 67 and the magnetization 63a of the fixed magnetic layer 63 is given away to become close to the parallel state. Consequently, the resistance R of the second magneto-resistance element 27 is gradually decreased taking along the curve HR3. Meanwhile, when the external magnetic field in the negative direction (−H) changes to the zero, the resistance R of the second magneto-resistance element 27 is gradually increased with following the curve HR4.

Accordingly, in the second magneto-resistance element 27, a hysteresis loop HR surrounded by the curves HR3 and HR4 is formed according to the variation in magnetic field magnitude of the external magnetic field in the negative direction (−H). The hysteresis loop HR is the central value between the maximum resistance and the minimum resistance of the second magneto-resistance element 27 and a central value of a width of the hysteresis loop HR is a middle point of the hysteresis loop HR. The magnitude of the Hin2 (i.e. a second inter-layer coupling magnetic field) is determined by the magnitude of the magnetic field in the range of the center point of the hysteresis loop HR to the magnetic field line H=0 (Oe). As shown in FIG. 3, in the second magneto-resistance element 27, Hin2 (i.e. the second inter-layer coupling magnetic field) is shifted toward the magnetic field in the negative direction.

In the embodiment, the Hin1 (i.e. the first inter-layer coupling magnetic field) of the first magneto-resistance element 23 is shifted to the magnetic field in the positive direction. Then the Hin2 (i.e. the second inter-layer coupling magnetic field) of the second magneto-resistance element 27 is shifted to the magnetic field in the negative direction.

The Hin1 and Hin2, the inter-layer coupling magnetic field, which has an opposite magnetic field direction illustrated in FIGS. 3 and 4 can be extracted, for example, by adequately adjusting a gas flow (a gas pressure) or a voltage at the time of performing a plasma treatment (PT) on the surface of the non-magnetic intermediate layer 64. According to a level of the gas flow (the gas pressure) and the voltage, a changing of the Hin (i.e. the inter-layer coupling magnetic field) may be recognized. When the level of the gas flow (the gas pressure) or the voltage is increased, the Hin (i.e. the inter-layer coupling magnetic field) can vary from the negative direction to the positive direction. In addition, the magnitude of the Hin (i.e. the inter-layer coupling magnetic field) varies by the thickness of the non-magnetic intermediate layer 64 The magnitude of the Hin (i.e. the inter-layer coupling magnetic field) can be adjusted by changing the thickness of the film of the antiferromagnetic layer when it is sequentially laminated from the bottom of the antiferromagnetic layer, the fixed magnetic layer, the non-magnetic intermediate layer, and the free magnetic layer.

In the first magneto-resistance element 23, the Hin1 (i.e. the first inter-layer coupling magnetic field) is in the positive direction with the consequence that an interaction of the magnetization to be parallel acts between the fixed magnetic layer 63 and the free magnetic layer 65. In the second magneto-resistance element 27, the Hin2 (i.e. the second inter-layer coupling magnetic field) is in the negative direction with the consequence that an interaction of the magnetization to be anti-parallel acts between the fixed magnetic layer 63 and the free magnetic layer 67. An exchanging coupling magnetic field (Hex) in the same direction between the antiferromagnetic layer 62 and the fixed magnetic layer 63 of each magneto-resistance element 23 and 27 is made by the heat treatment in the magnetic field, whereby the magnetization 63a of the fixed magnetic layer 63 of each magneto-resistance element 23 and 27 can be fixed in the same direction. Additionally, the above mentioned interaction acts between the fixed magnetic layer 63 and the free magnetic layers 65 and 67 to be the state of magnetic field as shown in FIG. 7.

The first magneto-resistance element 23 and the second magneto-resistance element 27 uses the method of a giant magneto-resistance (a GMR effect), but an AMR element using an anisotropic magneto-resistance and a TMR element using a tunnel magneto-resistance except for a GMR element may be used.

Figure 8:
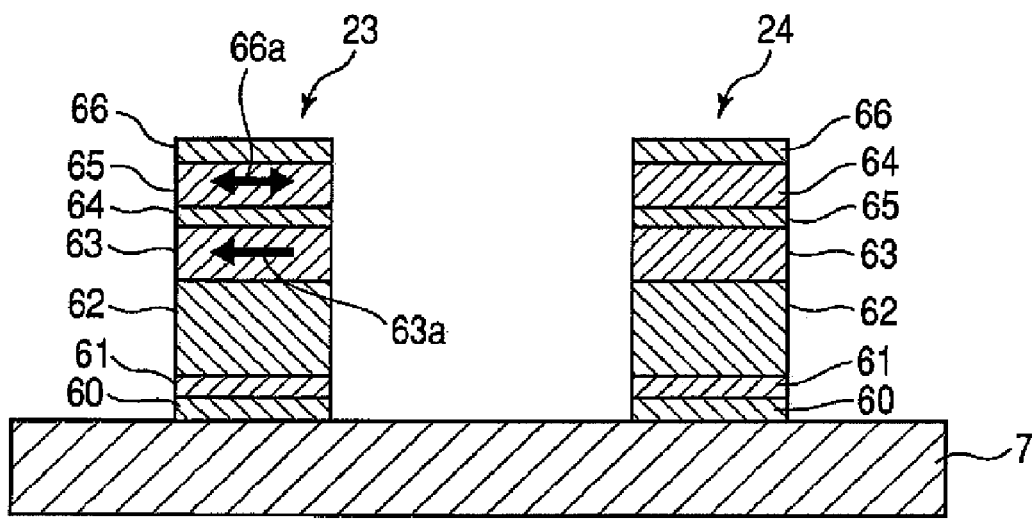
FIG. 8 is a partially sectional view illustrating the construction of the layer of a fixed resistance element.
Figure 8:
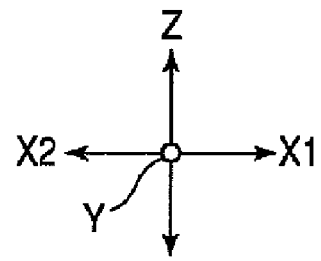

Meanwhile, the fixed resistance element 24 which is connected to the first magneto-resistance element 23 in series has a different lamination order from the first magneto-resistance element 23, which is formed of the same material layer as the first magneto-resistance element 23. Namely, as shown in FIG. 8, the fixed resistance element 24 is sequentially laminated from the bottom of the underlying layer 60, the seed layer 61, the antiferromagnetic layer 62, the first magnetic layer 63, the second magnetic layer 65, a non-magnetic intermediate layer 64, and the protection layer 66. The first magnetic layer 63 is corresponded to the fixed magnetic layer 63 included in the first magneto-resistance element 23. The second magnetic layer 65 is corresponded to the free magnetic layer 65 included in the first magneto-resistance element 23. As shown in FIG. 8, in the first fixed resistance element 24, the first magnetic layer 63 and the second magnetic layer 65 is sequentially laminated on the antiferromagnetic layer 62, whereby all of the magnetizations of the first magnetic layer 63 and the second magnetic layer 65 are fixed by the exchanging coupling magnetic field (HEX) which is generated between antiferromagnetic layer 62. The magnetization of the second magnetic layer 65 does not vary due to the external magnetic field, same as the free magnetic layer 65 of the first magneto-resistance element 23.

As shown in FIG. 8, when each layer of the fixed resistance element 24 is formed of the same material as the corresponding layer of the first magneto-resistance element 23, the element resistance of the first magneto-resistance element 23 and the fixed resistance element 24 can be almost the same. The irregularity of the temperature coefficients (TCR) of the first magneto-resistance element 23 and the fixed resistance element 24 can be suppressed, thereby improving an operational stability because the irregularity of the central potential according to a temperature variation can be suppressed. Additionally, it is more preferable that the material be the same and the thickness corresponding to the first magneto-resistance element 23 be the same.

As described above, although not shown in drawings, the fixed resistance element 28 which is connected to the second magneto-resistance element 27 in series has a different lamination order from the second magneto-resistance element 27, but has the same material layers as the second magneto-resistance element 27.

Additionally, the fixed resistance elements 31 and 32 constituting the third series circuit 34 have no limitation in a layer structure in particular when the element resistances forming the same material layer have almost the same value. Specifically, the fixed resistance elements 31 and 32 can be formed of a single layer including resistance material such as the material having high sheet resistance. However it is preferable that a production process be simplified by the process forming the fixed resistance elements 24 and 28 constituting the first series circuit 26 and the second series circuit 30 with forming the fixed resistance elements 31 and 32 simultaneously. Therefore, it is preferable that the resistance element be formed of the same material layers as the first magneto-resistance element 23 or the second magneto-resistance element 27 because the lamination order is just different from the first magneto-resistance element 23 or the second magneto-resistance element 27, like wise the fixed resistance elements 24 and 28 constituting the first series circuit 26 and the second series circuit 30.

In the following content, a detection theory of the external magnetic field will be described.

Figure 2:
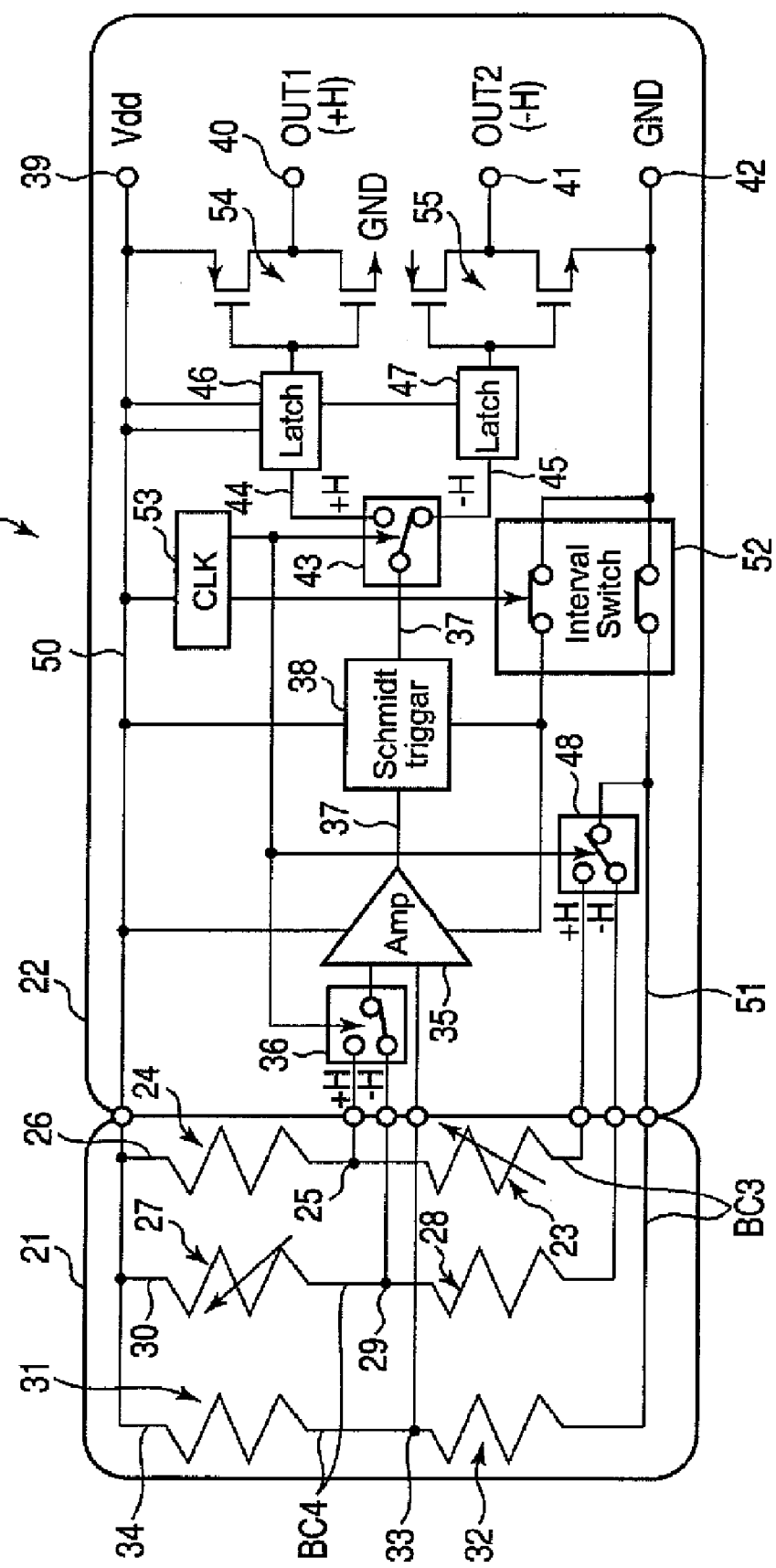
FIG. 2 is a circuit diagram illustrating a state of the external magnetic field detection circuit in the negative direction of the magnetic detection device according to an embodiment.

First, it will be described in case that the external magnetic field doesn't act on the magnetic detection device 20 in this embodiment. Considering aforementioned condition, both resistance of the first magneto-resistance element 23 and the second magneto-resistance element 27 are not varied. When the clock signal acquired from the clock circuit 53 is respectively sent to the first switch circuit 36, the second switch circuit 43 and the third switch circuit, there is switched over at intervals of dozen micro seconds, in condition of the positive directional external magnetic field (+H) detection circuit in which the first switch 36 connect between the first output extracting portion 25 of the first series circuit 26 and the differential amplifier 35, the second switch 43 connect between the comparator 38 and the first external output terminal 40 and the third terminal 48 connect between the first series circuit 26 and the earth terminal 42 as shown in FIG. 1 and in condition of the negative directional external magnetic field (−H) detection circuit in which the first switch 36 connect between the second output extracting portion 29 of the second series circuit 30 and the differential amplifier 35, the second switch 43 connect between the comparator 38 and the second external output terminal 41 and the third terminal 48 connect between the second series circuit 30 and the earth terminal 42 as shown in FIG. 2.

When the external magnetic field is not reached to the magnetic detection device, the differential potential between the first output extracting portion 25 and the third output extracting portion 33 of the first bridge circuit BC3 becomes almost zero in the condition of the positive directional external magnetic field (+H) detection circuit in FIG. 1. When the output having the differential potential of zero is outputted to the comparator 38 from the differential amplifier 35, such as high level signal is controlled so as to output from the first external output terminal 40 and the second external output terminal 41 through the latch circuits 46 and 47, and the FET circuit 54 by the schmitt trigger input in the comparator 38.

In the next, if the external magnetic field in the positive direction (+H) acts on the magnetic detection device 20 of the embodiment, the resistance of the first magneto-resistance element 23 is varied. As the result, the central potential in the first output extracting portion 25 of the first series circuit 26 is also varied. For example, if the circuit configuration in FIG. 1 has the hysteresis characteristics in FIG. 3, specifically the potential is increased.

In this external magnetic field detection circuit condition in the positive direction (+H) as shown in FIG. 1, the central potential of the third output extracting portion 33 in the third series circuit 34 is set to a reference potential, and the differential potential between the first output extracting portion 25 and the third output extracting portion 33 of the first bridge circuit BC3 formed of the first series circuit 26 and the third series circuit 34 is generated from the differential amplifier 35, and outputted to the comparator 38. The comparator 38 varies the differential potential to shape into pulse signal by the schmitt trigger input, and shaped detection pulse signal is outputted from the first external output terminal 40 through the latch circuit 46 and the FET circuit 54. In this case, if the magnitude of external magnetic field in the positive direction (+H) is not less than a predetermined magnitude, the detection signal is controlled to output as a low level signal from the first external output terminal 40. Additionally, the magnitude of the external magnetic field in the positive direction (+H) is smaller than a predetermined magnitude, the detection signal is controlled to generate a high level signal in the comparator 38, and there is no difference as compared with the case that the external magnetic field does not act.

Contrarily, when the external magnetic field of the positive direction (+H) is acting, even the magnetic detection device is switched over in state of the external magnetic field (−H) detection circuit of the negative direction in FIG. 2, the resistance of the second magneto-resistance element 27 is not varied. Therefore, in the same manner as the external magnetic field does not act, the high level signal is controlled to output from the second external output terminal 41.

Likewise, when the predetermined magnitude and more of external magnetic field in the positive direction (+H) acts on the magnetic detection device, then whether the high or low level signal varies into an opposite level signal. Therefore, the first external output terminal 40 performs the function to be capable of detecting the action of the positive directional external magnetic field (+H) by changing of the signal level.

In the same manner, when the external magnetic field in the negative direction (−H) acts on the magnetic detection device 20 of the embodiment, the resistance of the second magneto-resistance element 27 is varied. As the result, the central potential in the second output extracting portion of the second series circuit 30 is varied. For example, if the circuit configuration in FIG. 2 has the hysteresis characteristics in FIG. 4, specifically the potential is increased.

In this external magnetic field (−H) detection circuit condition in the negative direction as shown in FIG. 2, the central potential of the third output extracting portion 33 in the third series circuit 34 is set to a reference potential, and the differential potential between the second output extracting portion 29 and the third output extracting portion 33 of the second bridge circuit BC4 formed of the second series circuit 30 and the third series circuit 34 is generated from the differential amplifier 35, and outputted to the comparator 38. The comparator 38 varies the differential potential to shape into pulse signal by the schmitt trigger input, and shaped detection pulse signal is outputted from the second external output terminal 41 through the latch circuit 47 and the FET circuit 55. In this case, if the magnitude of external magnetic field in the negative direction (−H) is not less than a predetermined magnitude, the detection signal is controlled to output as a low level signal from the second external output terminal 41. Additionally, the magnitude of the external magnetic field (+H) in the negative direction is smaller than a predetermined magnitude, the detection signal is controlled to generate a high level signal in the comparator 38, and there is no difference as compared with the case that the external magnetic field does not act.

Contrarily, when the external magnetic field of the negative direction (−H) is acting, even the magnetic detection device is switched over in state of the external magnetic field (+H) detection circuit of the positive direction in FIG. 2, the resistance of the first magneto-resistance element 23 is not varied. Therefore, in the same manner as the external magnetic field does not act, the high level signal is controlled to output from the first external output terminal 40.

Likewise, when the predetermined magnitude and more of external magnetic field in the negative direction (−H) acts on the magnetic detection device, then whether the high or low level signal varies into an opposite level signal. Therefore, the second external output terminal 41 performs the function to be capable of detecting the action of the negative directional external magnetic field (−H) by changing of the signal level.

The magnitude of the external magnetic field in the negative direction (−H) is smaller than a predetermined magnitude, the detection signal is controlled to generate a high level signal in the comparator 38, and there is no difference as compared with the case that the external magnetic field does not act.

The detection signal outputted from the first external output terminal 40 or the second external output terminal 41 is used as a signal processing circuit and the like of other device part that does not illustrate. More specifically, the detection signal is used such as a detection signal for opening and closing of a foldable cellular phone mentioned later.

Figure 6:
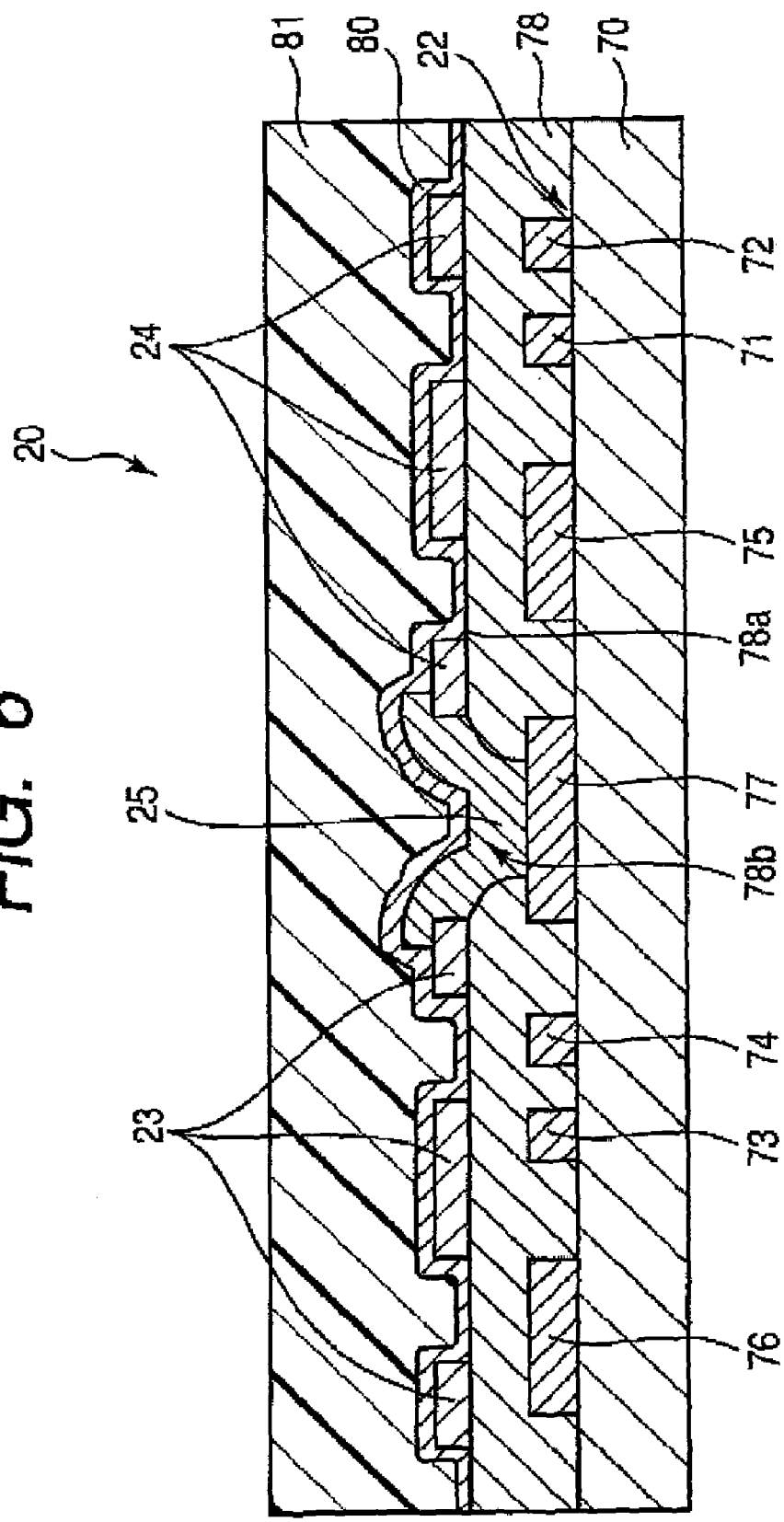
FIG. 6 is a partially sectional view of the magnetic detection device taken along Line A-A of FIG. 5 as viewed in the direction of an arrow.

Next, the partially sectional view of the magnetic detection device 20 according to embodiment in FIG. 6 will be described. As shown in FIG. 6, in the magnetic detection device 20, an underlying film made of silica (SiO2) not shown in the drawings is formed of a predetermined thickness on the substrate 70 formed of, for example, Si (Si).

Active elements 71 to 74 such as a differential amplifier or a comparator or the like included in the integrated circuit 22 or resistance elements 75 and 76, an interconnection layer (signal line) 77, and the like are formed on the underlying film. The interconnection layer 77 is formed of, for example, aluminum (Al).

As shown in FIG. 6, front surfaces of the substrate 70 and the integrated circuit 22 are covered by an insulating layer 78 formed of a resistance element layer and the like. In the insulating layer 78, a through hole 78b is formed on a certain part of the interconnection layer 77 and the front surface of the interconnection layer 78b is disclosed from the through hole 78b.

The front surface 78a of the insulating layer 78 is formed to be a flat surface. On the flat front surface 78a of the insulating layer 78, the first magneto-resistance element 23, the second magneto-resistance element 27, the fixed resistance elements 24, 28, 31 and 32 are formed in a meandering shape as shown in FIG. 5, whereby the element resistances of each element can be increased and the consumption current can be decreased.

As shown in FIG. 5, electrodes 23a, 23b, 24a, 24b, 27a, 27b, 28a, 28b, 32a, 32b, 33a, and 33b are formed on both ends of each element. The electrode 23b of the first magneto-resistance element 23 is connected to the electrode 24b of the fixed resistance element 24 through the first output extracting portion 25. As shown in FIG. 6, the first output extracting portion 25 is electrically connected to the interconnection layer 77. Similarly, an electrode 27b of the second magneto-resistance element 27 is connected to the electrode 28b of the fixed resistance element 28 through the second output extracting portion 29 and the second output extracting portion 29 is electrically connected to the interconnection layer not shown in the drawings. An electrode 32b of the fixed resistance element 32 is connected to the electrode 31b of the fixed resistance element 31 through the third output extracting portion 33 and the third output extracting portion 33 is electrically connected to the interconnection layer not shown in the drawings.

As shown in FIG. 6, the front surfaces of the element, the electrode, and the output extracting portion are covered by the insulating layer 80 formed of, for example, alumina or silica. The magnetic detection device 20 is packaged by a mold resin 81.

Next, a special feature of the magnetic detection device 20 according to embodiment will be described.

The magnetic detection device 20 is a NS detection magnetic sensor having the first bridge circuit BC3 to detect the external magnetic field of the positive direction (+H) and the second bridge circuit BC4 to detect the external magnetic field of the negative direction (−H).

In the embodiment, a central potential of a third series circuit 34 connected to a fixed resistance element 31 and 32 in series is formed of a common potential as a reference potential of the first bridge circuit BC3 and the second bridge circuit BC4. Additionally, an inside integrated circuit 22 is provided with a first switch circuit 36 switching over alternately a connection between a differential amplifier 35 and a first output extracting portion of a first series circuit 26 forming the first bridge circuit BC3, and a connection between a differential amplifier 35 and a second output extracting portion 29 of a second series circuit 30 forming the second bridge circuit BC4.

As mentioned above, the magnetic detection device 20 of the embodiment is the NS detection magnetic sensor, however, using the third series circuit 34 as common circuit at both first bridge circuit BC3 and second bridge circuit BC4, the embodiment can reduce the number of elements since the required elements number of the embodiment are totally 6 as illustrated in FIG. 1 and FIG. 2 in comparison that the total required elements number of the NS detection type sensor using the magneto-resistance element in the past are at least 8.

One of the advantages reducing the number of elements is such as forming each element to have larger space in the limited area for forming elements other than an improvement of production efficiency. Each element is formed of a meander shape to increase in the element resistance as shown in FIG. 5. However, subsequently, a length of each element may have longer length than a length of the element formed by conventional method since each element can be formed to have larger space than the element formed by conventional method. As the result, the resistance of the elements may be controlled to increase properly.

Furthermore, by configuring the third series circuit 34 to be a common circuit of the first bridge circuit BC3 and the second bridge circuit BC4 according to embodiment, the third output extracting portion 33 of the third series circuit 34 is directly connected to one of the differential amplifier 35, and then the circuit configuration is formed to switch over connecting between the differential amplifier 35 and the second output extracting portion 29 of the second series circuit 30, and connecting between the differential amplifier 35 and the first output extracting portion 25 of the first series circuit 26, by using the first switch circuit 36. In the circuit configuration that is provided with just one differential amplifier 35, it is possible to obtain alternately both external magnetic field detection conditions of the positive direction connected the first bridge circuit BC3 with the differential amplifier 35 (in FIG. 1) and negative direction connected the second bridge circuit BC4 with the differential amplifier 35 (in FIG. 2). As the result, the differential potential in the differential amplifier 35 is properly obtained from both of the first bridge circuit BC3 and the second bridge circuit BC4 by using the simple circuit configuration.

According to the embodiment, the number of the signal line is reduced because just one comparator 38 is enough, therefore the circuit configuration may be simplified, and the circuit may decrease in size.

According to the aforementioned embodiment, the dipole correspondence type sensor may have such advantages as decrease in the number of elements, a simple circuit configuration.

In addition, as shown in FIG. 1 and FIG. 2 according to the embodiment, the magnetic detection device is provided with a second switch circuit 43 switching over a connection between the differential amplifier 35 and two external output terminal 40 and 41, and the differential amplifier 35 and the first external output terminal 40 are connected to each other through the second switch circuit 43 when the first output extracting portion 25 and the differential amplifier 35 are connected to each other through the first switch circuit 36, and the differential amplifier 35 and the second external output terminal 41 are connected to each other through the second switch circuit 43 when the second output extracting portion 29 and the differential amplifier 35 are connected to each other through the first switch circuit 36.

according to the embodiment, the magnetic detection device is provided with two external output terminal 40 and 41, whereby the first switch circuit 36 and the second switch circuit 43 is operated together, therefore the detection signal of the positive directional external magnetic field (+H) can be obtained from the first external output terminal 40, and the detection signal of the negative directional external magnetic field (−H) can be obtained from the second external output terminal 41. As the result, a direction of the external magnetic field can be detected according to whether the detection signal from the first output terminal or the second output terminal by using a two way output.

In addition, the third switch circuit 48 is provided to switch over a connecting between the earth terminal 42 and the first series circuit 26, and a connecting between the earth terminal 42 and the second series circuit 30 according to embodiment.

Furthermore, the third switch circuit 48 connects the first series circuit 26 with the earth terminal 42 when the first switch circuit 36 connects the first bridge circuit BC3 with the differential amplifier 35, and the third switch circuit 48 connects the second series circuit 30 with the earth terminal 42 when the first switch circuit 36 connects the second bridge circuit BC4 with the differential amplifier 35. In this circumstance, there is no electric current in the second series circuit 30 when the first switch circuit 36 connects the first bridge circuit BC3 with the differential amplifier 35, and there is no electric current in the first series circuit 26 when the first switch circuit 36 connects the second bridge circuit BC4 with the differential amplifier 35. As the result, the magnetic detection device has advantages that one is a low consumption current and the other one is an improvement of detection sensitivity.

The magnetic detection device may be provided with a third switch circuit 48 between an input terminal 39 and the first series circuit 26, and between an input terminal 39 and the second series circuit 30 along with the earth terminal 42, or instead of the earth terminal 42.

In the embodiment, the magnetic detection device 20 of the NS detection type is used such as a detection device for opening and closing of a foldable cellular phone.

Figure 9:
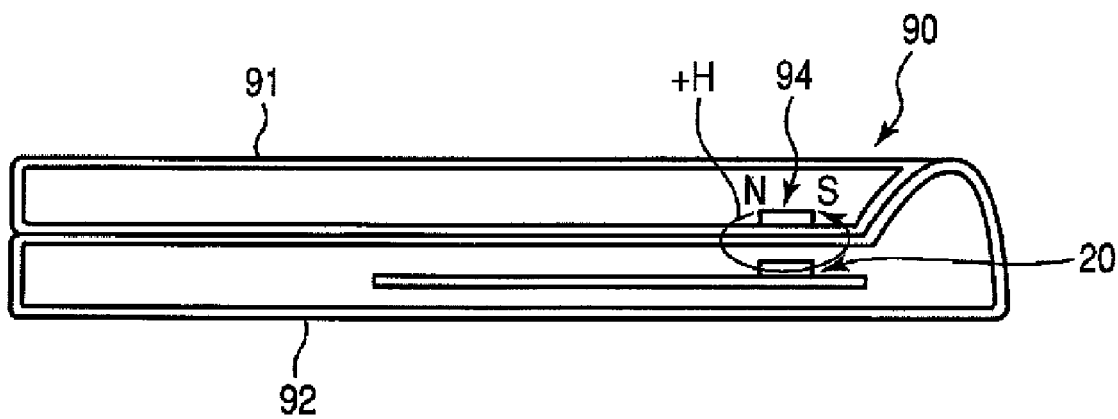
FIG. 9 is an example illustrating a use of the magnetic detection device according to the embodiment (a partially schematic view of a foldable cellular phone having the magnetic detection device when the cellular phone is folded).

As shown in FIG. 9, a foldable cellular phone 90 includes a first member 91 and a second member 92. The first member 91 is a screen display portion, and the second member 92 is a manipulation portion. A facing surface of the first member 91 with the second member 92 is provided with a liquid crystal display (LCD), a receiver or the like. A facing surface of the second member 92 with the first member 91 is provided with various type buttons and a microphone. FIG. 9 is illustrated in folding state of the foldable cellular phone 90. As shown in FIG. 9, the first member 91 has a magnet 94, and the second member 92 has the magnetic detection device 20 of the embodiment. The magnet 94 and the magnetic detection device 20 are disposed at positions apposite to each other in the folding state as shown in FIG. 9. Alternatively the magnetic detection device 20 may be disposed at a position departing from the direction parallel to an application direction of the external magnetic field other than the position facing the magnet 94.

In FIG. 9, the positive directional external magnetic field (+H) emitted from the magnet 94 acts on the magnetic detection device 20, and the external magnetic field (+H) is detected in the magnetic detection device 20, whereby the folding state of the foldable cellular phone 90 is detected.

Figure 10:
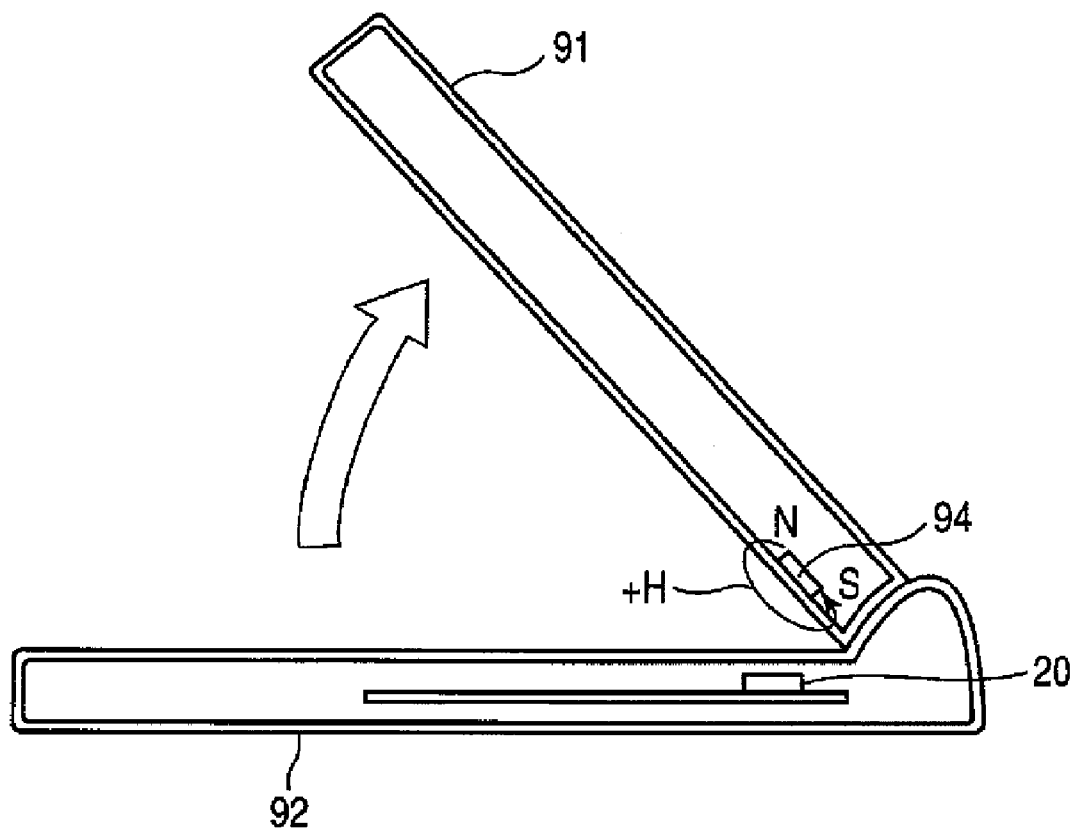
FIG. 10 is an example illustrating the use of the magnetic detection device according to embodiment (a partially schematic view of a foldable cellular phone having the magnetic detection device when the cellular phone is opened).

Conversely, when the foldable cellular phone 90 is opened as shown in FIG. 10, the first member 91 is gradually withdrawn from the second member 92, accordingly the magnitude of the external magnetic field (+H) that acts on the magnetic detection device 20 gradually becomes smaller, and then the magnitude of the external magnetic field (+H) acting on the magnetic detection device 20 becomes zero. The magnitude of the external magnetic field (+H) acting on the magnetic detection device 20 is not more than a predetermined value, whereby the foldable cellular phone 90 is detected in an open state. For example, a backlight in a rear side of the liquid crystal display or the manipulation buttons is controlled to emit light by a control unit built in the foldable cellular phone 90.

Figure 11:
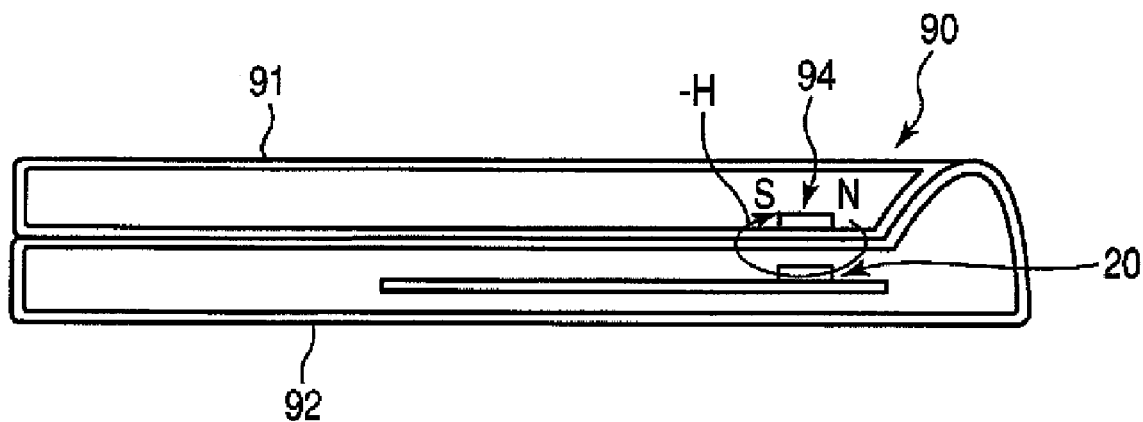
FIG. 11 is an example illustrating the use of the magnetic detection device according to the embodiment (a partially schematic view of a foldable cellular phone having the magnetic detection device and a magnetic disposed in opposite direction of FIG. 9 when the cellular phone is folded).

The magnetic detection device 20 of the embodiment is the NS detection sensor. That is, an N pole of the magnet 94 is disposed on a left side of the illustration portion of the magnet and an S pole is disposed on a right side of the illustration portion in FIG. 9. On the contrary, when the polarity is inversely disposed as shown in FIG. 11, for example the N pole is right side and the S pole is left side, the direction of the external magnetic field (−H) acting on the magnetic detection device 20 (hereinafter, it is called the negative direction) and the direction of the external magnetic field (+H) in FIG. 1 are reversed to each other. In the condition of the embodiment, the open operation of the foldable cellular phone 90 can be properly detected when the folding state of the cellular phone 90 in FIG. 11 is changed into the opening state in FIG. 12.

Accordingly, there is no limitation to dispose the magnet 94 without any consideration about the polarity of the external magnetic field, therefore an assembly of the foldable cellular phone is easy to form.

In the aforementioned detection method about opening and closing of the foldable cellular phone, though the magnetic detection device can not detect the direction of the external magnetic field, it is allowed to detect just the variation of the external magnetic field in the dipole. In particular, it is possible to configure the device by using any one of the external output terminal 40 or 41.

For instance, the third switch circuit 43 is removed in FIG. 1 and FIG. 2, so that one signal line is formed to reach the output terminal 40 through the latch circuit 46 and the FET circuit 54 from the comparator 38. Then the detection signal of the external magnetic field in the positive direction (+H) and the external magnetic field in the negative direction (−H) can be obtained from the external output terminal 40. In this case, since both detection signals are such as the low level signal as above mentioned, the signal cannot be distinguished whether the positive direction or negative direction of the external magnetic field, but there is no needs to detect the direction of the external magnetic field in the detection for opening and closing. Therefore, it is possible to form more simply the circuit configuration by using just one external output terminal.

By contrast, in case of operating variable functions according to the direction of the external magnetic field, such as a foldable cellular phone 100 of a turn over type in FIG. 13 and FIG. 14 as mentioned below, it is recommended to configure the magnetic detection device being detectable even in the direction of the external magnetic field by forming both external output terminal 40 and 41 as shown in FIG. 1 and FIG. 2.

Figure 12:
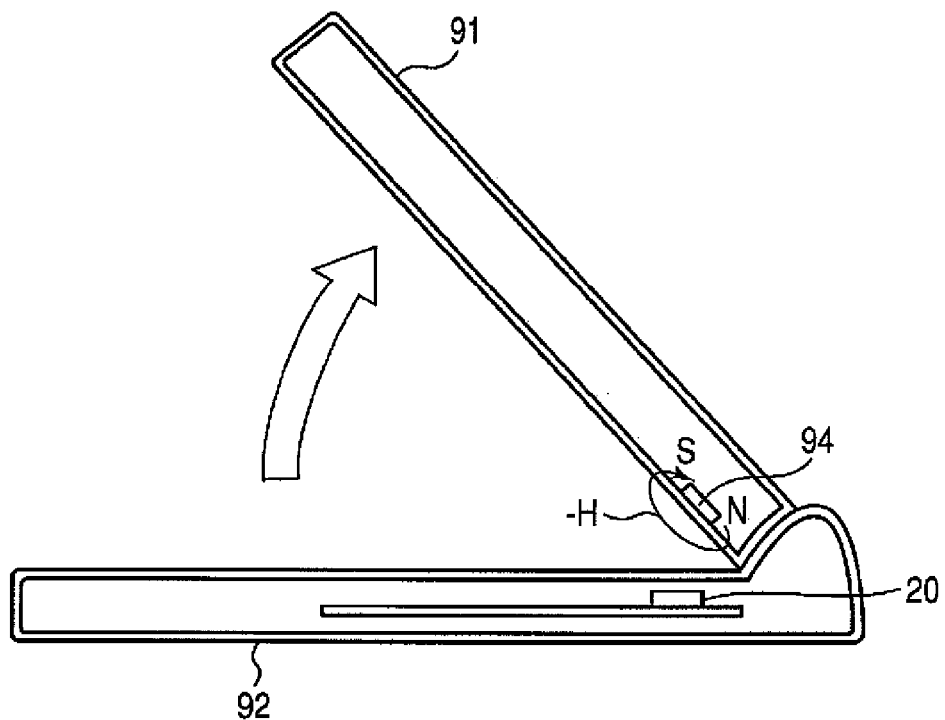
FIG. 12 is an example illustrating the use of the magnetic detection device according to embodiment (a partially schematic view of a foldable cellular phone having the magnetic detection device and a magnet disposed opposite to the direction of FIG. 10 when the cellular phone is opened).
Figure 13:
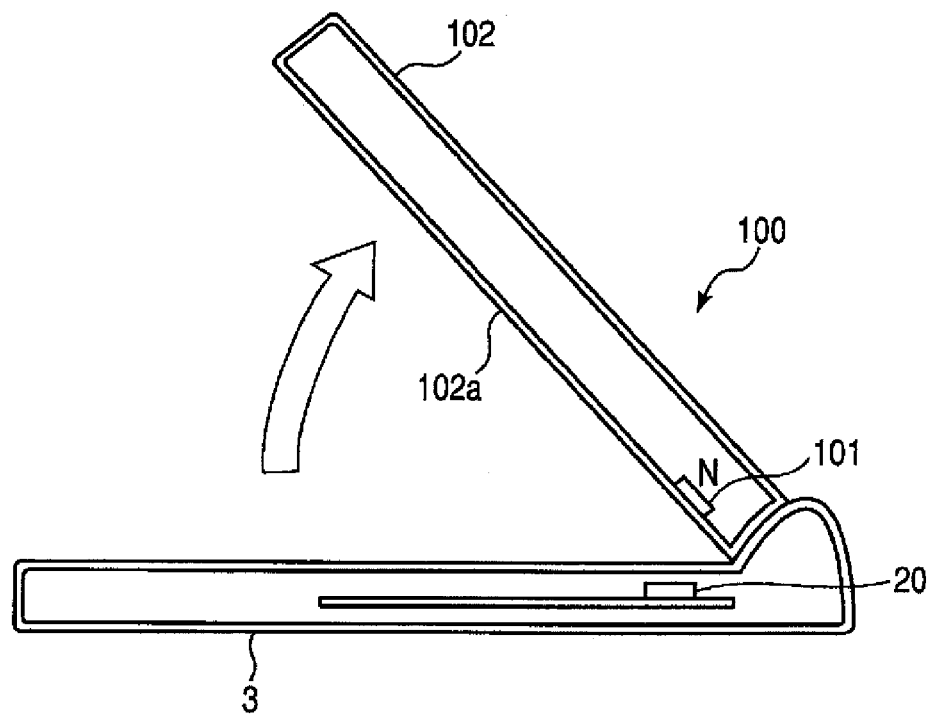
FIG. 13 is an example illustrating the use of the magnetic detection device according to embodiment (a partially schematic view of the foldable cellular phone having the magnetic detection device when the cellular phone is opened).
Figure 14:
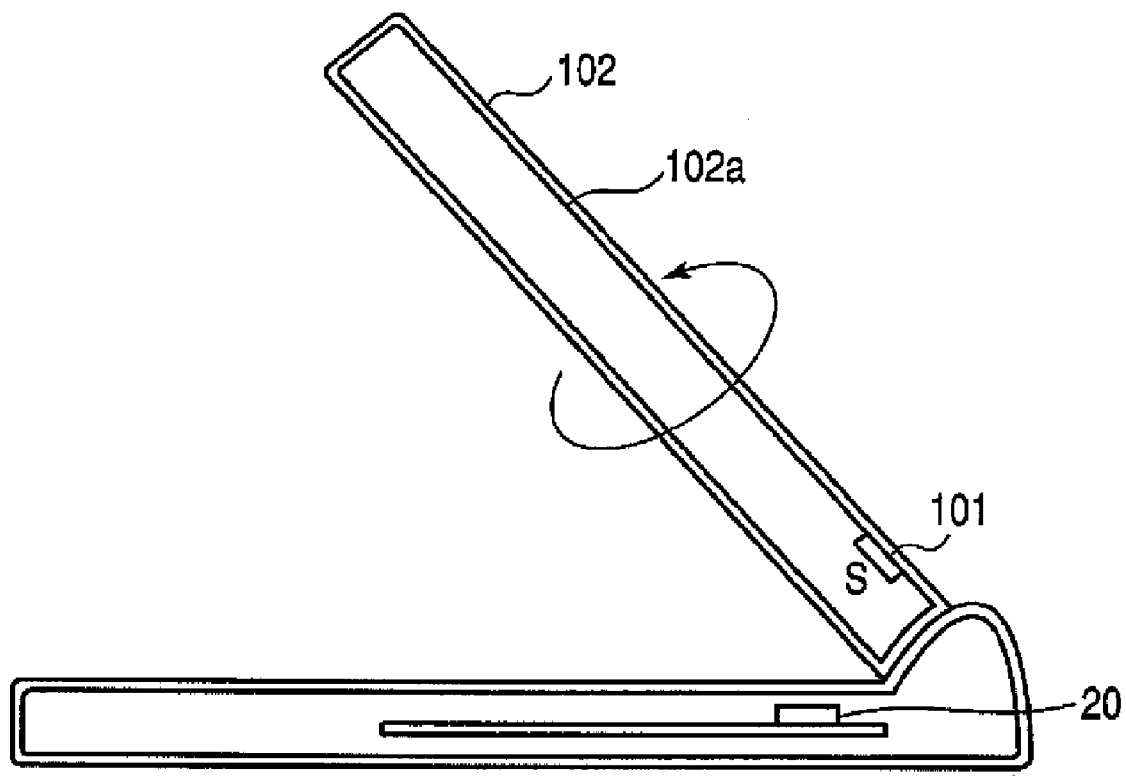
FIG. 14 is an example illustrating the use of the magnetic detection device according to embodiment (a partially schematic view of the foldable cellular phone having the magnetic detection device when a first member is turned over).
Figure 15:
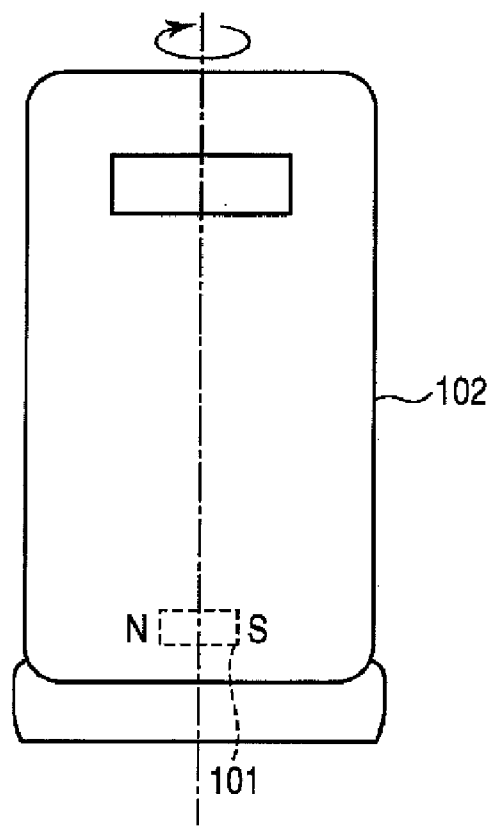
FIG. 15 is an example illustrating the use of the magnetic detection device according to embodiment (a partially plan view of a foldable cellular phone having the magnetic detection device illustrated in FIG. 13).
Figure 16:
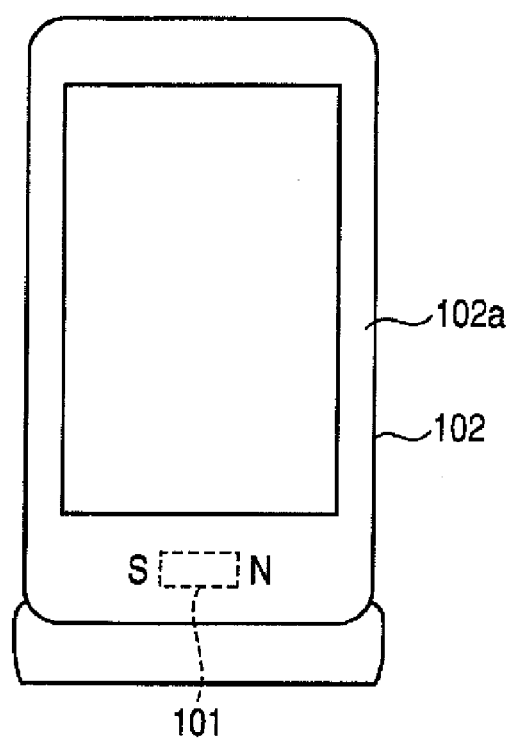
FIG. 16 is an example illustrating the use of the magnetic detection device according to embodiment (a partially plan view of a foldable cellular phone having the magnetic detection device illustrated in FIG. 15).

When the foldable cellular phone 100 is opened as shown FIG. 13, the opening state of the foldable cellular phone is detected according to the intensity variation of the external magnetic field acting on the magnetic detection device 20 as illustrated in FIG. 10 and FIG. 12. An arrangement of a magnet 101 in FIG. 13 is the same as a top view in FIG. 15, the first member 102 of the foldable cellular phone 100 is rotated by 180 degrees about a rotation axis, so that the screen display surface 102a located on an inside of the first member in state of FIG. 13 is set to face outside as shown in FIG. 14 and FIG. 16. Whereby a direction of the magnet 101 is reversed from a disposition state in FIG. 15 as shown in FIG. 16. For example, when a camera function is operated by turning over the first member 102, the magnetic detection device 20 should detect the reversing state of the direction of the magnet 101 other than the detection function for the opening and closing the cellular phone 100 as shown in FIG. 13. However, the magnetic detection device 20 of the embodiment can detect whether the positive directional external magnetic field (+H) or the negative directional external magnetic field (−H) in accordance with the circuit configuration having two output terminals 40 and 41 as shown in FIG. 1 and FIG. 2.

Figure 17:
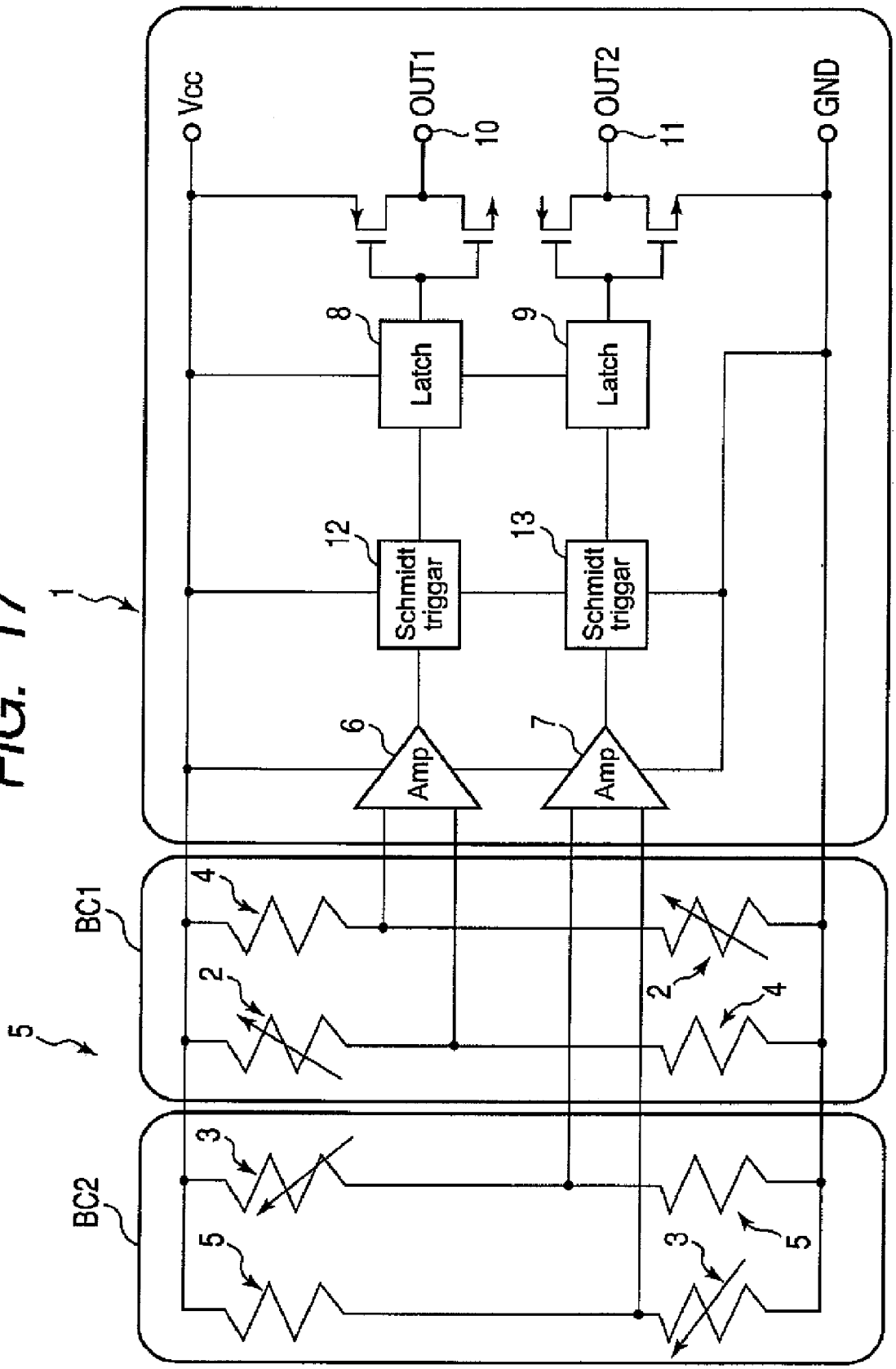
FIG. 17 is a circuit diagram illustrating a known magnetic detection device.

The element configuration of the sensor unit 21 is just an example in this embodiment, there is no need to be limited in the element configuration. According to the embodiment, the first bridge circuit BC3 detect the external magnetic field of the positive direction (+H) and the second bridge circuit BC4 detect the external magnetic field of the negative direction (−H). However, it may be allowed that bridge circuits commonly have series circuits along with detecting an external magnetic field of a positive direction and a negative direction by using both bridge circuit BC3 and BC4. For example, the fifth and the sixth resistance element 31 and 34 which are commonly included in the first bridge circuit BC3 and the second bridge circuit BC4 are the fixed resistance elements which are not varied with the external magnetic field in the element configuration of the sensor unit 21 according to embodiment. Therefore, the differential potential is smaller than the conventional sensor configuration in FIG. 17 because differential potential of the first bridge circuit BC3 and the second bridge circuit BC4 are generated by setting up fixed potential in the third output extracting portion with a reference potential.

Accordingly, to obtain a differential potential equal to the differential potential in case of the conventional sensor configuration, the fifth resistance element 31 illustrated in FIG. 1 and FIG. 2 may be formed of a magneto-resistance element such as the first magneto-resistance element 23 disposed at the first series circuit 26, and the sixth resistance element 32 illustrated in FIG. 1 and FIG. 2 may be formed of a magneto-resistance element such as the second magneto-resistance element 27 disposed at the second series circuit 30.

Alternatively, the second resistance element 24 connected to the first series circuit 26 as shown in FIG. 1 and FIG. 2, and the fourth resistance element 28 connected to the second series circuit 30 is the fixed resistance element such as an invariable resistance in response to the external magnetic field. On the contrary, the second resistance element 24 has a variable electrical resistance in response to positive directional external magnetic field (+H), but the second resistance element 24 is formed of the magneto-resistance element which have inverse pattern compared with the first magneto-resistance element 23 in increase and decrease of the resistance corresponding to the intensity variation of the external magnetic field. The fourth resistance element 28 has variable electrical resistance in response to negative directional external magnetic field (−H), but the second resistance element 24 is formed of the magneto-resistance element which have inverse pattern compared with the second magneto-resistance element 27 in increase and decrease of the resistance corresponding to the intensity variation of the external magnetic field. Consequently, it is preferable because the differential potential may increase and the detection sensitivity may have good performance.

In the embodiment illustrated in FIG. 1 and FIG. 2, a external magnetic field gradually increase from a reference state as a zero external magnetic field state (non magnetic field state) in the first bridge circuit BC3 including the first series circuit 26 and the third series circuit 34, and the second bridge circuit BC4 including the second series circuit 30 and the third series circuit 34, whereby increase and decrease patterns of the differential potentials are the same when the positive directional external magnetic field and the negative directional external magnetic field is applied. Likewise, forming of the same increase and decrease patterns of the differential potentials, a control is easy and enough to use one comparator 38 because there is no need to change an input value of the schmitt trigger of the comparator 38 when the positive directional external magnetic field and the negative directional external magnetic field is applied.

Additionally, the switch circuit 36, 43, and 48 is presented as the first switch portion, the second switch portion, and the third switch portion, however it is not limited in switch circuit. Specifically, it may be possible using an active element having a function of switch.

Moreover, it is selectable whether or not to apply a bias magnetic field on the magneto-resistance element. There are no needs to apply the bias magnetic field to free magnetic layer included in the magneto-resistance element. On the contrary, for example, a magnetization of the fixed magnetic layer and the free magnetic layer are controlled to be orthogonal each other in state where the external magnetic field does not exist when the bias magnetic field is applied.

Further more, the magnetic detection device 20 may be available for the opening and closing detection of electronic devices such as game device and the like, other than the opening and closing detection of the foldable cellular phone. The embodiment is also available for not only the opening and closing detection mentioned above, but also a use required the magnetic detection device 20 of the NS detection type.

What is claimed is:

1. A magnetic detection device comprising:
a first series circuit,
a second series circuit, and
a third series circuit, wherein at least one of a plurality of resistance elements forming the first series circuit includes a first magneto-resistance element using a magneto-resistance effect, of which an electric resistance varies with an external magnetic field of any one direction;
wherein at least one of a plurality of resistance elements forming the second series circuit includes a second magneto-resistance element using a magneto-resistance effect, of which an electric resistance varies with an external magnetic field of a direction opposite to the one direction;
wherein a plurality of resistance elements forming the third series circuit is common resistance elements connected to the resistance elements of the first series circuit and the resistance elements of the second series circuit in a bridge manner;
wherein a first output extracting portion of the first series circuit and a second output extracting portion of the second series circuit are individually connected to a common differential output portion through a first switch portion and a third output extracting portion of the third series circuit is connected to the common differential output portion, and
wherein a first bridge circuit so as to detect the external magnetic field of the one direction including the first series circuit and the third series circuit connected in parallel to each other is switched to a connection state with the differential output portion when the first output extracting portion is connected to the differential output portion by the first switch portion, and a second bridge circuit so as to detect the external magnetic field of the opposite direction including the second series circuit and the third series circuit connected in parallel to each other is switched to a connection state with the differential output portion when the second output extracting portion is connected to the differential output portion by the first switch portion.

2. The magnetic detection device according to claim 1,
wherein a first resistance element and a second resistance element of the first series circuit are connected in series through the first output extracting portion, and the first resistance element is formed of the first magneto-resistance element;
wherein a third resistance element and a fourth resistance element of the second series circuit are connected in series through the second output extracting portion, and the third resistance element is formed of the second magneto-resistance element;
wherein a fifth resistance element and a sixth resistance element of the third series circuit are connected in series through the third output extracting portion;
wherein the first resistance element is connected in parallel to the sixth resistance element and the second resistance element is connected in parallel to the fifth resistance element, thereby forming the first bridge circuit, and
wherein the third resistance element is connected in parallel to the fifth resistance element and the fourth resistance element is connected in parallel to the sixth resistance element, thereby forming the second bridge circuit.

3. The magnetic detection device according to claim 1, further comprising:
a first external output terminal;
a second external output terminal, and
a second switch portion switching over a connection between the differential output portion and the first external output terminal and a connection between the differential output portion and the second external output terminal,
wherein the differential output portion and the first external output terminal are connected to each other by the second switch portion when the first output extracting portion and the differential output portion are connected to each other by the first switch portion, and the differential output portion and the second external output terminal are connected to each other by the second switch portion when the second output extracting portion and the differential output portion are connected to each other by the first switch portion.

4. The magnetic detection device according to claim 1, further comprising a third switch portion switching over a connection between the first series circuit and at least one of an input terminal and an earth terminal, and a connection between the second series circuit and the at least one of the input terminal and the earth terminal,
wherein the first series circuit and one of the terminals are connected to each other by the third switch portion when the first output extracting portion and the differential output portion are connected to each other by the first switch portion, and the second series circuit and the one terminal are connected to each other by the third switch portion when the second output extracting portion and the differential output portion are connected to each other by the first switch portion.

* * * * *